US009917588B2

(12) United States Patent
Blutman et al.

(10) Patent No.: US 9,917,588 B2
(45) Date of Patent: Mar. 13, 2018

(54) LEVEL SHIFTER AND APPROACH THEREFOR

(71) Applicant: NXP B.V., Eindhoven (NL)

(72) Inventors: Kristof Blutman, Eindhoven (NL); Ajay Kapoor, Eindhoven (NL); Jose Pineda de Gyvez, Eindhoven (NL); Arnoud van der Wel, Vught (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/794,411

(22) Filed: Jul. 8, 2015

(65) Prior Publication Data
US 2017/0012628 A1    Jan. 12, 2017

(51) Int. Cl.
*H03L 5/00* (2006.01)
*H03K 19/0185* (2006.01)
*H03K 5/13* (2014.01)

(52) U.S. Cl.
CPC ....... *H03K 19/018514* (2013.01); *H03K 5/13* (2013.01); *H03K 19/0185* (2013.01)

(58) Field of Classification Search
CPC ..... H03K 19/018521; H03K 3/356113; H03K 19/00315; H03K 19/018528; G11C 8/08; G11C 5/145; G11C 7/12
See application file for complete search history.

(56) References Cited

U.S. PATENT DOCUMENTS

| | | | |
|---|---|---|---|
| 5,867,040 A | 2/1999 | Fuse et al. | |
| 6,479,974 B2 | 11/2002 | Cohn et al. | |
| 6,600,679 B2 | 7/2003 | Tanzawa et al. | |
| 7,002,371 B2 | 2/2006 | Kase et al. | |
| 7,329,968 B2 | 2/2008 | Shepard et al. | |
| 7,768,308 B2 * | 8/2010 | Maede | H03K 3/356113 327/333 |

(Continued)

FOREIGN PATENT DOCUMENTS

| CN | 101866635 | * 10/2010 |
|---|---|---|
| CN | 101866635 A | 10/2010 |

OTHER PUBLICATIONS

Rajapandian, S.; Shepard, Kenneth L; Hazucha, P.; Karnik, T., "High-voltage power delivery through charge recycling," Solid-State Circuits, IEEE Journal of , vol. 41, No. 6, pp. 1400,1410, Jun. 2006.

(Continued)

*Primary Examiner* — Long Nguyen

(57) ABSTRACT

Aspects of the disclosure are directed to communications between respective power domains (circuitry) that may operate in a stacked arrangement in which the each domain operates over a different voltage range. A first circuit provides differential outputs that vary between first and second voltage levels, based on transitions of an input signal received from a first one of the power domains. First and second driver circuits are respectively coupled to the first and second differential outputs. A third driver circuit operates with the first and second circuits to level-shift the input signal from the first power domain to an output signal on a second power domain by driving an output circuit at the second voltage level in response to the input signal being at the first voltage level, and driving the output circuit at a third voltage level in response to the input signal being at the second voltage level.

14 Claims, 10 Drawing Sheets

(56) References Cited

U.S. PATENT DOCUMENTS

| | | | |
|---|---|---|---|
| 8,169,257 | B2 | 5/2012 | Pelley |
| 8,476,962 | B2 | 7/2013 | Pelley |
| 8,624,641 | B1 | 1/2014 | Faucher et al. |
| 8,704,579 | B2 * | 4/2014 | Chen ............... H03K 3/356113 327/333 |
| 8,878,387 | B1 | 11/2014 | Wong et al. |
| 2004/0090259 | A1 | 5/2004 | Randazzo et al. |
| 2006/0119390 | A1 | 6/2006 | Sutardja |
| 2010/0109705 | A1 * | 5/2010 | Pamperin ......... H03K 3/356113 327/333 |
| 2010/0259299 | A1 | 10/2010 | Dennard et al. |
| 2012/0256656 | A1 | 10/2012 | Stirk et al. |
| 2014/0300188 | A1 | 10/2014 | Boezen |
| 2014/0340142 | A1 | 11/2014 | Wong et al. |
| 2015/0102795 | A1 | 4/2015 | Gao |
| 2015/0346742 | A1 | 12/2015 | Kapoor et al. |
| 2017/0012627 | A1 | 1/2017 | Kapoor et al. |

OTHER PUBLICATIONS

Ueda, K.; Morishita, F.; Okura, S.; Okamura, L.; Yoshihara, T.; Arimoto, K., "Low-Power On-Chip Charge-Recycling DC-DC Conversion Circuit and System," Solid-State Circuits, IEEE Journal of , vol. 48, No. 11, pp. 2608,2617, Nov. 2013 Abstract Only.

Meyvaert, H.; Van Breussegem, T.; Steyaert, M., "A 1.65W fully integrated 90nm Bulk CMOS Intrinsic Charge Recycling capacitive DC-DC converter: Design & techniques for high power density," Energy Conversion Congress and Exposition (ECCE), 2011 IEEE , vol., No., pp. 3234,3241, Sep. 17-22, 2011.

Ismail, Yousr; Yang, Chih-Kong Ken, "A compact stacked-device output driver in low-voltage CMOS Technology," Circuits and Systems (ISCAS), 2014 IEEE International Symposium on , vol., No., pp. 1624,1627, Jun. 1-5, 2014 Abstract Only.

Junhua Liu; Le Ye; Zhixin Deng; Jinshu Zhao; Huailin Liao, "A 1.8V to 10V CMOS level shifter for RFID transponders," Solid-State and Integrated Circuit Technology (ICSICT), 2010 10th IEEE International Conference on , vol., No., pp. 491,493, Nov. 1-4, 2010 Abstract Only.

Moghe, Y.; Lehmann, T.; Piessens, T., "Nanosecond Delay Floating High Voltage Level Shifters in a 0.35 m HV-CMOS Technology," Solid-State Circuits, IEEE Journal of , vol. 46, No. 2, pp. 485,497, Feb. 2011doi: 10.1109/JSSC.2010.2091322.

Dong Pan; Li, H.W.; Wilamowski, B.M., "A low voltage to high voltage level shifter circuit for MEMS application," University/Government/Industry Microelectronics Symposium, 2003. Proceedings of the 15th Biennial , vol., No., pp. 128,131, Jun. 30-Jul. 2, 2003.

Serneels, B.; Steyaert, M.; Dehaene, W., "A High speed, Low Voltage to High Voltage Level Shifter in Standard 1.2V 0.13μm CMOS," Electronics, Circuits and Systems, 2006. ICECS '06. 13th IEEE International Conference on , vol., No., pp. 668,671, Dec. 10-13, 2006.

Mohammadi, Babak; Rodrigues, Joachim Neves, "A 65 nm single stage 28 fJ/cycle 0.12 to 1.2V level-shifter," Circuits and Systems (ISCAS), 2014 IEEE International Symposium on , vol., No., pp. 990,993, Jun. 1-5, 2014 Abstract Only.

Extended European Search Report for EP Patent Application 16175288.6 (Dec. 1, 2016).

Ueda, K. et al. "Low-Power On-Chip Charge-Recycling DC-DC Conversion Circuit and System", IEEE Journal of Solid-State Circuits, vol. 48, No. 11, pp. 2608-2617 (2013).

Ismail, Y. et al. "A Compact Stacked-Device Output Driver in Low-Voltage CMOS Technology", IEEE International Symposium on Circuits and Systems, pp. 1624-1627 (2014).

Liu, J. et al. "A 1.8V to 10V CMOS Level Shifter for RFID Transponders", IEEE International Conference on Solid-State and Integrated Circuit Technology, pp. 491-493 (2010).

Mohammadi, B. et al. "A 65 nm Single Stage 28 fJ/cycle 0.12 to 1.2V Level-Shifter", IEEE International Symposium on Circuits and Systems, pp. 990-993 (2014).

Extended European Search Report for Patent Appln. No. 16175288.6 (dated Mar. 20, 2017).

* cited by examiner

LEVEL SHIFTER AND APPROACH THEREFOR

Aspects of various embodiments are directed to level shifting circuitry, which can be implemented for a variety of applications.

Level shifters are implemented in a variety of manners, for various types of circuitry. For instance, level shifters may be used for interfacing between voltage stacks in which different types of circuitry operate under different voltage ranges (e.g., between voltage rails at different voltage levels). In this context, level shifters may operate to receive an input signal from one power domain operating on one power level, shift the voltage level of the input signal, and pass the input signal having its voltage level shifted on to another power domain.

While useful, many level shifting circuits are susceptible to undesirable drawbacks. For instance, capacitors used in effecting various level shifting approaches may need to be relatively large, possibly forty times the size of other devices in the circuitry. In addition, level shifters can be susceptible to undesirable operation if there is a ripple in supply voltage or uneven supply voltage values for the two domains (e.g., capacitors may become inefficient). Further, various level shifters can be functionally dependent upon an AC-path, which can render such level shifters prone to issues relating to signal frequency and slope (slew rate).

These and other matters have presented challenges to efficiencies of level shifter implementations, for a variety of applications.

Various example embodiments are directed to level shifters and related circuitry. In accordance with one or more embodiments, an apparatus includes a first circuit that provides differential outputs that vary between first and second voltage levels, based on transitions of an input signal received from a first power domain that operates between the first and second voltage levels. A second circuit has first and second driver circuits coupled to a voltage rail that operates at the second voltage level, with the first driver circuit being coupled to a first one of the differential outputs and the second driver circuit being coupled to a second one of the differential outputs. A third driver circuit is coupled to a voltage rail that operates at a third voltage level in which the second voltage level is between the first and third voltage levels. The third driver circuit is configured and arranged with the first and second circuits to level-shift the input signal from the first power domain to an output signal on a second power domain that operates between the second and third voltage levels by driving an output circuit at the second voltage level in response to the input signal being at the first voltage level, and driving the output circuit at the third voltage level in response to the input signal being at the second voltage level. In various contexts, the apparatus operates to provide shifted operation in which the level of signals passed between circuit domains is shifted as above, and flat operation in which the level of signals passed between circuit domains is not shifted.

Another embodiment is directed to a method as follows. Differential outputs are provided, which vary between first and second voltage levels based on transitions of an input signal received from a first power domain that operates between the first and second voltage levels. The input signal is level-shifted from the first power domain to an output signal on a second power domain that operates between the second and third voltage levels, using a first and second driver circuits coupled to a first voltage rail that operates at the second voltage level, in which the first driver circuit is coupled to a first one of the differential outputs and the second driver circuit is coupled to a second one of the differential outputs, and using a third driver circuit coupled to a second voltage rail that operates at a third voltage level in which the second voltage level is between the first and third voltage levels. The level shifting is carried out by driving an output circuit at the second voltage level in response to the input signal being at the first voltage level, and driving the output circuit at the third voltage level in response to the input signal being at the second voltage level.

Another embodiment is directed to an apparatus having a level shifter circuit that passes communications between a first circuit that operates under a first power domain having a first voltage range, and a second circuit that operates under a second power domain having a second voltage range. The level shifter circuit passes communications directly between the first and second circuits in a flat mode in which the first and second voltage ranges are common, and level-shifts a voltage level of communications passed between the first and second circuits in a stacked mode in which the first and second voltage ranges are different. The level shifting is effected by providing differential outputs that vary between first and second voltage levels, based on transitions of an input signal received from a first power domain that operates between the first and second voltage levels. The input signal is level-shifted from the first power domain to an output signal on a second power domain that operates between second and third voltage levels by driving an output circuit at the second voltage level in response to the input signal being at the first voltage level, and driving the output circuit at the third voltage level in response to the input signal being at the second voltage level.

In some embodiments, the level shifter circuit includes first and second driver circuits coupled to a voltage rail that operates at the second voltage level, the first driver circuit being coupled to receive a first one of the differential outputs and the second driver circuit being coupled to receive a second one of the differential outputs. A third driver circuit is coupled to a voltage rail that operates at a third voltage level, in which the second voltage level is between the first and third voltage levels. The driver circuits drive the output circuit at the second and third voltage levels.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
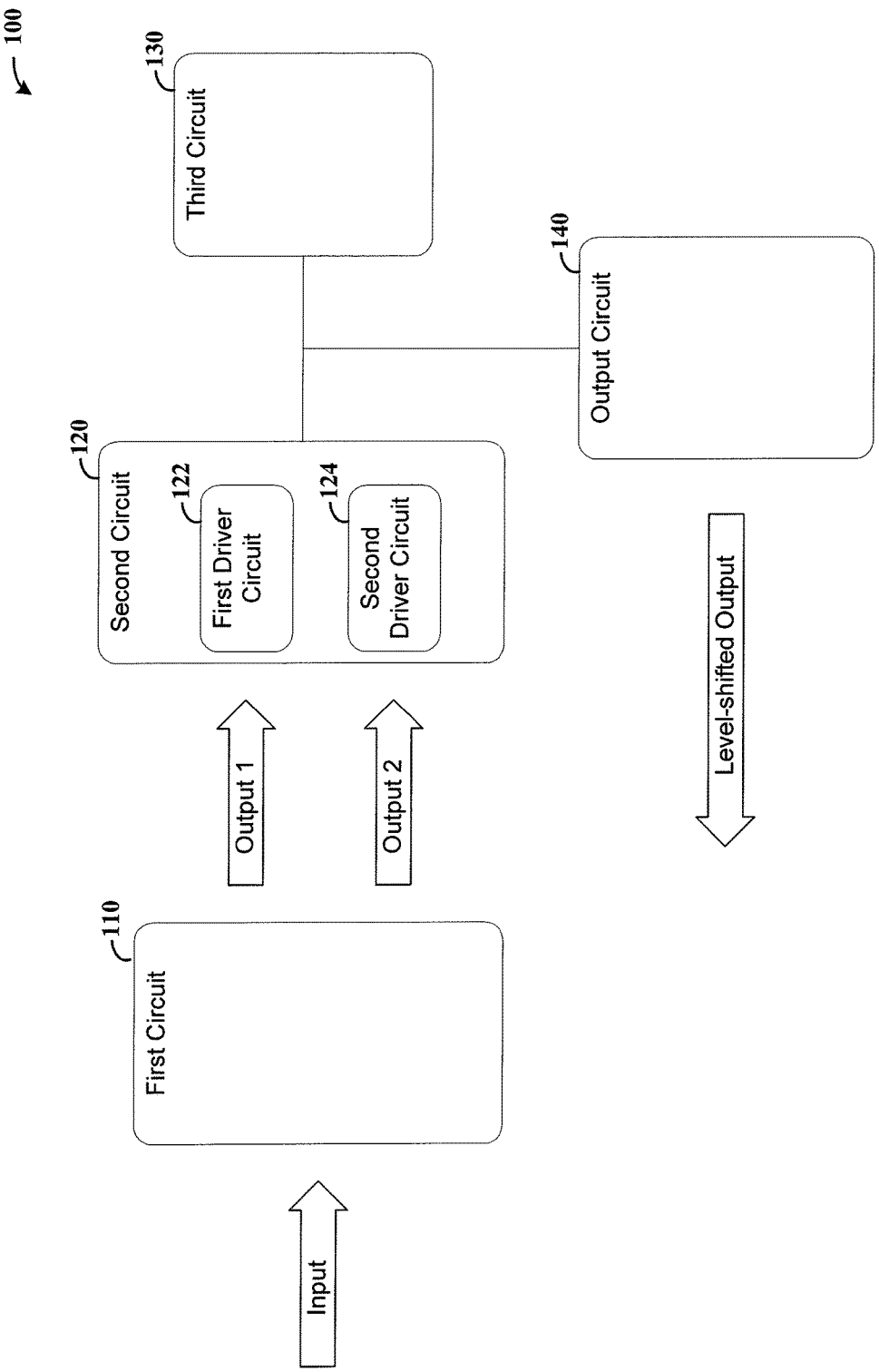
FIG. 1 shows a level shifting apparatus in accordance with one or more embodiments.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving level shifting. In certain implementations, aspects of the present disclosure have been shown to be beneficial when used in the context of communicating signals between respective power domains. In some embodiments, a voltage level of such signals is shifted in applications for which high changes in voltage levels are implemented for communicating signals between stacked power domains. For certain implementations, operating modes are effected such that an interface circuit operating to level shift selectively operates to directly pass signals for which level shifting is not necessary, facilitating desirable operational characteristics (e.g., related to power loss). In these and/or other implementations, level shifting circuitry can be implemented in a manner that involves transistor-based level shifting that can be implemented without necessarily employing capacitors. These and other aspects can be implemented to address challenges, including those discussed in the background above, and those relating to stacked power domains in which charge is recycled for static and dynamic power reduction, and in which relatively high rail voltage shifting occurs between power domains. These approaches can also be implemented with voltage converters and output drivers. While not necessarily so limited, various aspects may be appreciated through discussion of examples using such exemplary contexts.

In some embodiments, a signal elevating up- and down-level shifter circuit is implemented with thin-oxide devices for stacked power domains. This approach can be implemented without a capacitor, can be manufactured with CMOS processes and can be integrated in standard cell rows. Such a circuit can be implemented with low leakage to support standby operation, using a main latch supported by two sub-latches.

In accordance with one or more embodiments, a first circuit provides differential outputs that vary between first and second voltage levels, based on transitions of an input signal received from a first power domain that operates between the first and second voltage levels. For instance, series inverters may be used to provide respective outputs. First and second drivers are respectively coupled to first and second ones of the differential outputs, and operate using a second voltage level. A third driver circuit operates using a third voltage level that is between the first and third voltage levels. The driver circuits level-shift the input signal from the first power domain to an output signal on a second power domain (e.g., via an output circuit), with the output signal being at the second voltage level when the input signal is at the first voltage level, and at the third voltage level when the input signal is at the second voltage level. In some embodiments, the output circuit is driven at the second and third voltage levels for a stacked operation in which signals are provided between respective power domains operating at different voltage ranges, and at the first and second voltage levels in a disabled mode for a flat operation in which signals are provided between respective power domains operating over a common voltage range. In various contexts, the third driver circuit provides latch-type operation in which the output is driven at respective high and low levels based on the respective states of the first and second driver circuits.

In a more particular implementation, the output signal is transitioned from the second voltage level to the third voltage level by switching the third driver circuit from a first state in which the third voltage level is provided to the output circuit, to a second state in which a voltage rail at the third voltage level is decoupled from the output circuit. The output signal is transitioned from the third voltage level to the second voltage level by switching the third driver circuit from the second state to the first state in which the third voltage level is provided to the output circuit.

The third driver circuit may include, for example, first and second transistors as follows. The first transistor has its gate connected to an output of the second driver circuit and its source and drain connected between the voltage rail at the third voltage level and the output circuit. The second transistor has its gate connected to an output of the first driver circuit and the output circuit, and its source and drain connected between the second driver circuit and the voltage rail at the third voltage level.

In further implementations, the first driver circuit includes third and fourth transistors, the third transistor having its gate driven by a first one of the differential outputs and having its source and drain coupled between the second voltage level and the output terminal. The fourth transistor has its gate driven by the second voltage level and its source and drain coupled between the first differential output and the output circuit. The second driver circuit includes fifth and sixth transistors, the fifth transistor having its gate driven by a second one of the differential outputs and its source and drain coupled between the second voltage level and the third driver circuit. The sixth transistor has its gate driven by the second voltage level and its source and drain coupled between the second differential output and the third driver circuit.

The first circuit may include, for example, first and second inverter circuits that respectively invert the input signal and invert an output of the first inverter circuit. A seventh transistor has its source and drain coupled between the output of the first inverter circuit and the first driver circuit, and its gate connected to a voltage rail at the second voltage level. An eighth transistor has its source and drain coupled between an output of the second inverter circuit and the second driver circuit.

The output circuit may further include an inverter having an input coupled to the first driver circuit and the third driver circuit. The output signal is generated by generating an output at the second voltage level in response to the input receiving the third voltage level, and generating an output at the third voltage level in response to the input receiving the second voltage level.

In various implementations, a first one of a differential output as noted above is coupled to the first driver circuit while a second one of the differential outputs is decoupled from the second driver circuit for providing a first state of the input signal. A second state of the input signal is provided by coupling the second differential output to the second driver circuit and decoupling the first differential output from the first driver circuit.

Another embodiment is directed to a method as follows. Differential outputs are provided, which vary between first and second voltage levels based on transitions of an input signal received from a first power domain that operates between the first and second voltage levels. The input signal is level-shifted from the first power domain to an output signal on a second power domain that operates between the second and third voltage levels, using first and second driver circuits coupled to a first voltage rail that operates at the second voltage level, in which the first driver circuit is coupled to a first one of the differential outputs and the second driver circuit is coupled to a second one of the differential outputs, and using a third driver circuit coupled to a second voltage rail that operate at a third voltage level in which the second voltage level is between the first and third voltage levels. The level shifting is carried out by driving an output circuit at the second voltage level in response to the input signal being at the first voltage level, and driving the output circuit at the third voltage level in response to the input signal being at the second voltage level. Such an approach may be implemented for addressing one or more issues as noted above (e.g., without using a capacitive circuit to couple the first and second power domain). In certain implementations, a first one of the differential outputs to the first driver circuit and a second one of the differential outputs is decoupled from the second driver circuit for a first state. In a second state, the second differential output is coupled to the second driver circuit, and the first differential output is decoupled from the first driver circuit.

In some embodiments, the output circuit is driven at the second and third voltage levels by operating the output circuit for a stacked operation in which signals are provided between respective power domains operating at different voltage ranges. A disabled mode is provided in flat operation by providing signals between respective power domains operating over a common voltage range. In other embodiments, the output signal is driven from the second voltage level to the third voltage level by switching the third driver circuit from a first state in which the third voltage level is provided to the output circuit, to a second state in which a voltage rail at the third voltage level is decoupled from the output circuit. The output signal is transitioned from the third voltage level to the second voltage level by switching the third driver circuit from the second state to the first state in which the third voltage level is provided to the output circuit. In further embodiments, the output circuit is driven at the second voltage level in response to the input receiving the first voltage level, and driven at the third voltage level in response to the input receiving the second voltage level.

A variety of applications involve level shifters that include a transmitter, channel and receiver circuits. The transmitter handles signals coming from an input power domain, the channel interfaces between the input power domain and the output power domain, and the receiver provides signals to the output power domain. The transmitter may buffer the input signal and send it through the channel (e.g., as implemented with a chain of inverters). The channel may include a DC (direct current) path and an AC (alternating current) path. The DC path, which includes an inverter having its ground and power ports acting as an input and output, performs level translation of the input signal and provides the level-translated signal to the receiver side. This separates the two power domains and avoids overvoltage over what can be implemented as thin-oxide transistors in the transmitter and receiver. The AC path may address slow or power-consuming aspects of the DC path, and may include a large capacitor that couples the transmitter with the receiver and that ensures quick resolution or short metastability (thus decreasing delay and reducing power). The receiver, such as a latch or other bistable circuit, regenerates level-translated voltage values from the channel to provide a digitally valid output. In some implementations, delay and the power consumption of the level shifter is dependent on the latch, which can be implemented with high-threshold voltage (hvt) devices while the transmitter is implemented with low-threshold voltage (lvt) devices, to compensate for weak coupling between the different power domains.

Various embodiments involve a circuit-stacking approach in which throughput penalty is reduced or minimized for a high-throughput mode and charge recycling is used in a low power mode. In the low power mode, charge from a higher-voltage circuit is recycled to a lower-voltage circuit during dynamic and static modes. Such embodiments may be used such that a single computing platform may operate in multiple applications, including those that may benefit from one or more of fast transitions between standby mode and a high-throughput mode, low standby current consumption, or complete shutdown between computations. Various embodiments involve configuring a power domain of a full memory, part of memory, part of logic or part of memory and logic in these contexts.

Various embodiments involve a bypass level shifting approach in which a level shifter is bypassed under conditions in which level shifting is not needed, and used under conditions in which level shifting is desired. Such an approach can be implemented with low power designs using circuit-stacking, and mitigates related problems such as those discussed above. Accordingly, systems with two (or more) subparts can be configured into two primary configurations, such as by configuring respective power domains into flat (same power) and stacked (shifted power) configurations. An interface between these subparts operates in a flat mode in which minimal signal delay is incurred via passing signals between the subparts (e.g., without level shifting), and in a stacked mode in which signals are passed between the subparts with level shifting that adjusts the voltage (range) of the signals received from one of the subparts to a corresponding voltage at which the other one of the subparts operates. In these contexts, the subparts can be implemented with one or more of a variety of different types Turning now to the figures, FIG. 1 shows a level shifter apparatus 100, in accordance with another example embodiment. The apparatus includes a first circuit 110 that provides differential outputs that vary between first and second voltage levels, based on transitions of an input signal received from a first power domain that operates between the first and second voltage levels. A second circuit 120 has first and second driver circuits 122 and 124 respectively coupled to first and second ones of the differential outputs, and is operable for coupling to a voltage rail that operates at the second voltage level. A third (driver) circuit 130 is configured and arranged with the first and second circuits to level-shift the input signal from the first power domain to an output signal on a second power domain that operates between the second and third voltage levels by driving an output circuit 140 using a voltage rail that operates at a third voltage level (with the second voltage level being between the first and third voltage levels). Specifically, the output circuit 140 is driven at the second voltage level in response to the input signal being at the first voltage level, and at the third voltage level in response to the input signal being at the second voltage level.

Figure 2:
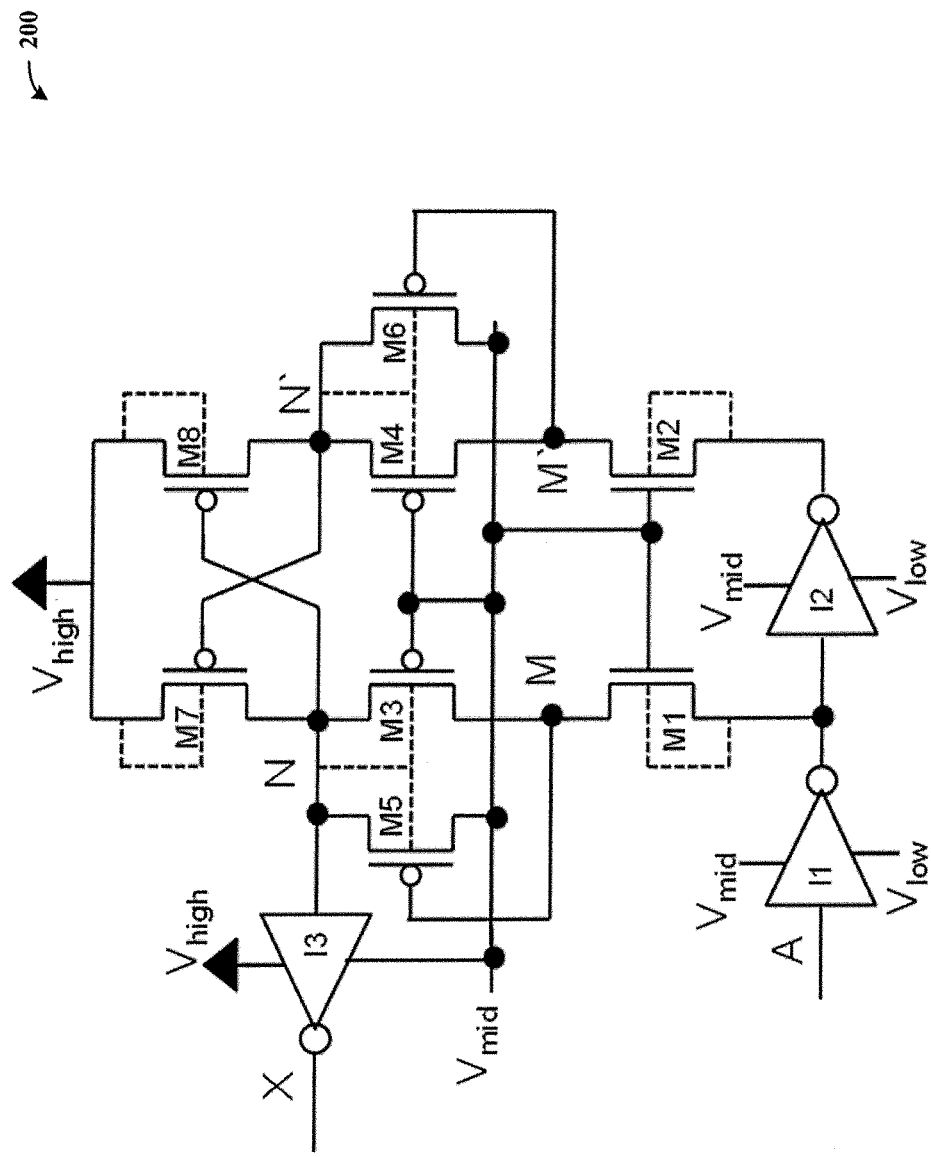
FIG. 2 shows a level shifter circuit, in accordance with another embodiment.

FIG. 2 shows a level shifter apparatus 200, in accordance with another example embodiment. By way of example, the schematic is shown as implemented for signal conversion from a bottom domain to a top domain, with the understanding that a complementary circuit may be implemented for signal conversion from a top to a bottom domain. Inverters I1 and I2 are in the bottom voltage domain while transistors (e.g., PMOS) M7, M8 and inverter I3 are in the top voltage domain. Transistors M1-M6 are shared between the top and bottom domains.

The apparatus 200 may operate to suit particular embodiments. In various implementations, the '1' (high) logic value of the bottom domain has the same voltage level as '0' (low) of the top domain, represented by $V_{mid}$. Signals are transferred between domains as follows. For an initial signal 'A' and 'X' are at respective '0' (low) logic values, nodes M, N are '1' (high) and M', N' are '0' (low). When signal 'A' changes state, (e.g., goes from '0' (low) to '1' (high) logic value), the output of I1 goes to '0' (low), and the output of I2 goes to '1' (high) of the bottom voltage domain. Therefore, M1 starts conducting and M2 is turned off. This leads to node-M being pulled '0' (low), thereby turning on the M5, which pulls node-N towards $V_{mid}$. At some point during this transition, M3 also starts conducting, pulling node-N down. This leads to flipping the state of a latch made by M7, M8 (positive feedback), meaning node-N will settle to '0' (low) $\{=V_{mid}\}$ and node-N' settles to '1' (high) $\{=V_{high}\}$. Thus, 'X' goes to '1' (high) and the transition is complete. The reverse happens during '1' (high) to '0' (low) logic transition. During the transition, the state of the latch is flipped by the pull-down action of either M1, M3, and M5 competing with M7, or by M2, M4, and M6 competing with M8. In this context, the dimensioning of these transistors can be set to achieve desirable operation.

Figure 3:
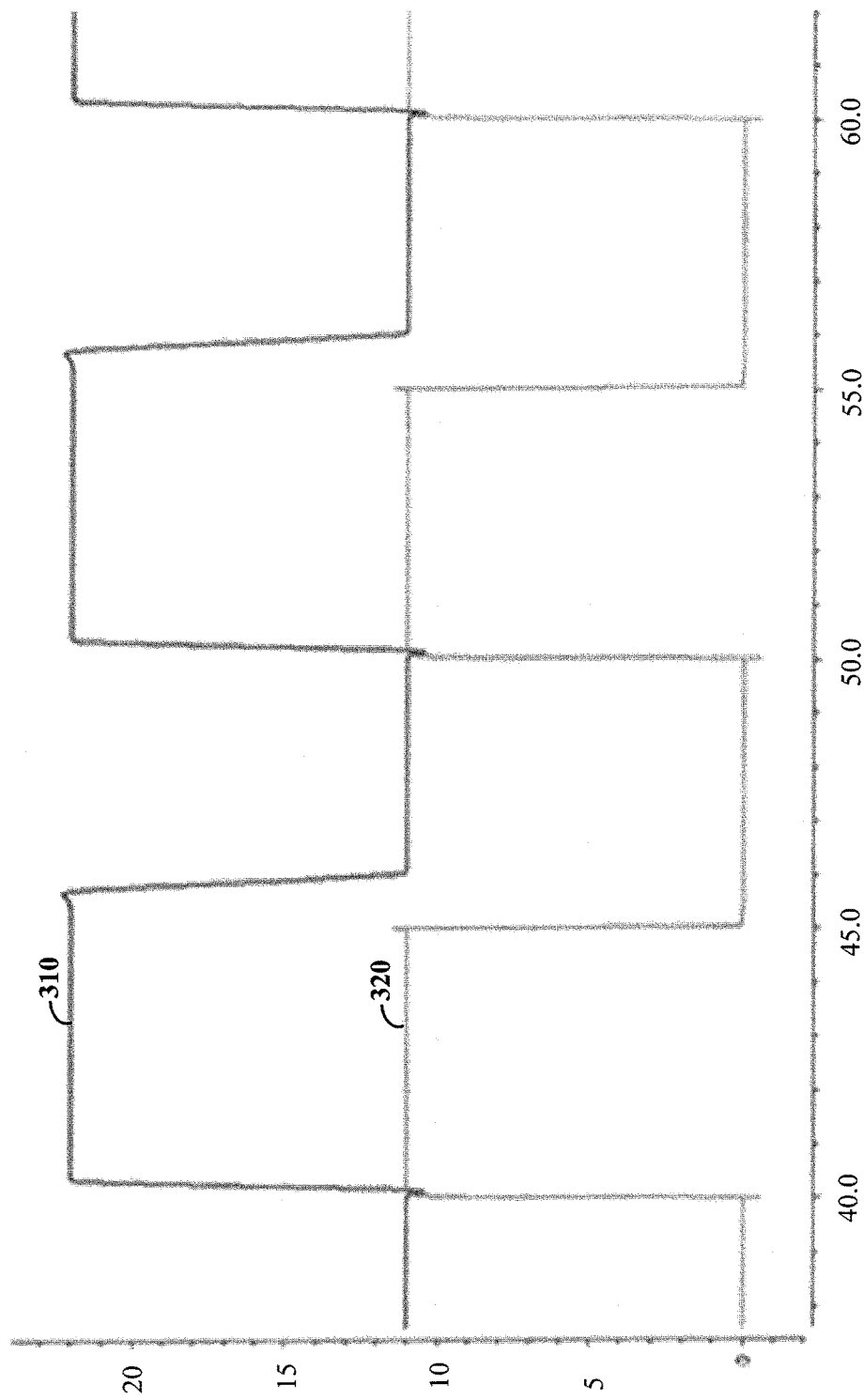
FIG. 3 shows plots of the operation of a level shifter with transition from low to high and from high to low, in accordance with one or more embodiments.

FIG. 3 shows plots of the operation of a level shifter with transition from low to high and from high to low, in accordance with one or more embodiments. The plots in FIG. 3 may be implemented with the circuit shown in FIG. 2 or other circuits operating under a similar approach. Time is shown in nanoseconds on the horizontal axis, and voltage is shown in volts on the vertical axis. Plot 310 shows an input signal, and plot 320 shows an output signal that is a level-shifted version of the input signal. A complimentary version in which a signal is transferred from a top voltage domain to low voltage domain can also be realized in a similar manner. Further, such approaches can be extended to multiple domains in addition to the two domains shown.

Figure 4:
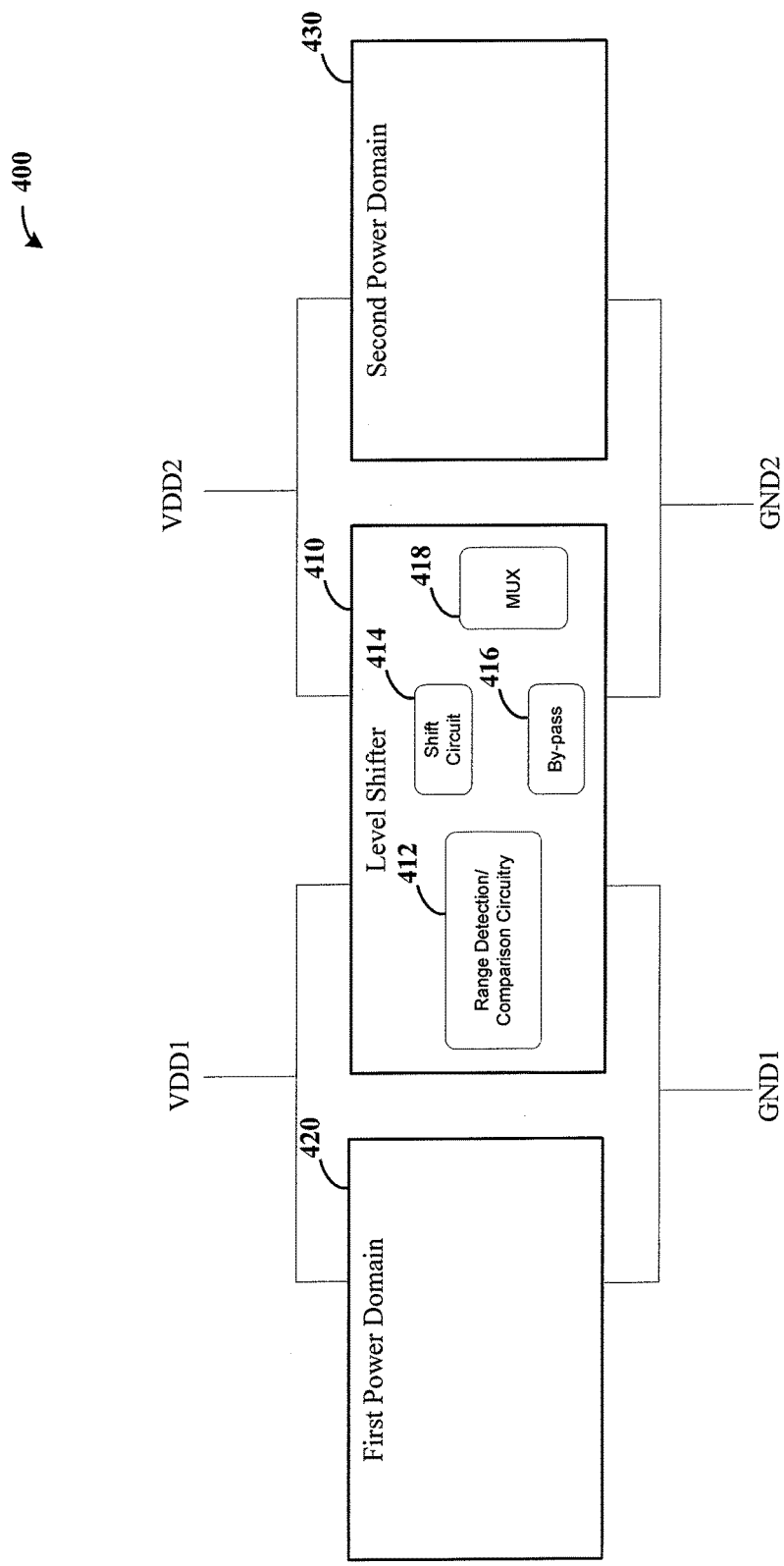
FIG. 4 shows a level shifter apparatus, as may be implemented in accordance with one or more embodiments.

FIG. 4 shows an apparatus 400, as may be implemented in accordance with one or more embodiments. The apparatus 400 includes level shifter circuitry 410 that operates to communicate signals between first power domain circuitry 420 and second power domain circuitry 430. Each of the power domains is coupled between respective power rails depicted as VDD and GND (e.g., a reference voltage level), with the first power domain operating between VDD1 and GND1, and the second power domain operating between VDD2 and GND2. Such an approach may be implemented with a variety of power domains and related circuit types, such as with embodiments in which the first power domain 420 is implemented with logic circuitry and second power domain 430 is implemented with memory circuitry.

In various implementations, the level shifter 410 operates to actively control the coupling of VDD1 to GND2 for a stacked mode, or the coupling of VDD2 to GND1 for another stacked mode. For a level mode, the level shifter 410 couples VDD1 to VDD2, and GND1 to GND2.

In some implementations, the level shifter 410 includes range detection/comparison circuitry 412 that operates to detect respective voltage levels/ranges of each power domain, and to control the operation of the level shifter in respective modes that are based on the detection. For instance, the respective power domains may be stacked with VDD1 high, GND1 and VDD2 coupled at a mid-level, and GND2 low. Under such a stacked condition, the range detection/comparison circuitry 412 detects the respective rail levels as being different, and operates to engage level shifting circuitry. This detection and related implementation of level shifting circuitry may, for example, be carried out autonomously or otherwise independent from any control signal. Where the respective power domains are flat or otherwise operated at a common voltage range, the range detection/comparison circuitry 412 operates such that signals are passed between the power domains without level shifting, bypassing the level shifting circuitry.

In some embodiments, the level shifter 410 includes a shift circuit 414 and a bypass circuit 416 that respectively operate to shift the level of signals passed between the power domains, or bypass the shift circuit such that the level of the signals is not shifted. Further, a multiplexer 418 may be employed to multiplex the respective circuit paths including the shift circuit 414 and the bypass circuit 416, as may be controlled or otherwise operated in accordance with the range detection/comparison circuitry 412.

As may be implemented in connection with FIG. 4 and/or with other level detection approaches and circuitry characterized herein, one or more embodiments employ a detection approach as follows. Using the circuitry depicted in FIG. 4 as an example, when VDD1=VDD2 and GND1=GND2, a flat mode is detected as both power domains operating over a common voltage range. When VDD1=GND2 and VDD2=VDD1+voltage of the second power domain, a stacked mode is detected. Various embodiments may facilitate detection of a stacked mode when VDD1=GND2 (with VDD2 being a higher voltage), or when VDD2=GND1 (with VDD1 being a higher voltage). Other embodiments may involve a comparison of VDD1 with VDD2, with a stacked architecture detected when the levels are different.

Figure 5:
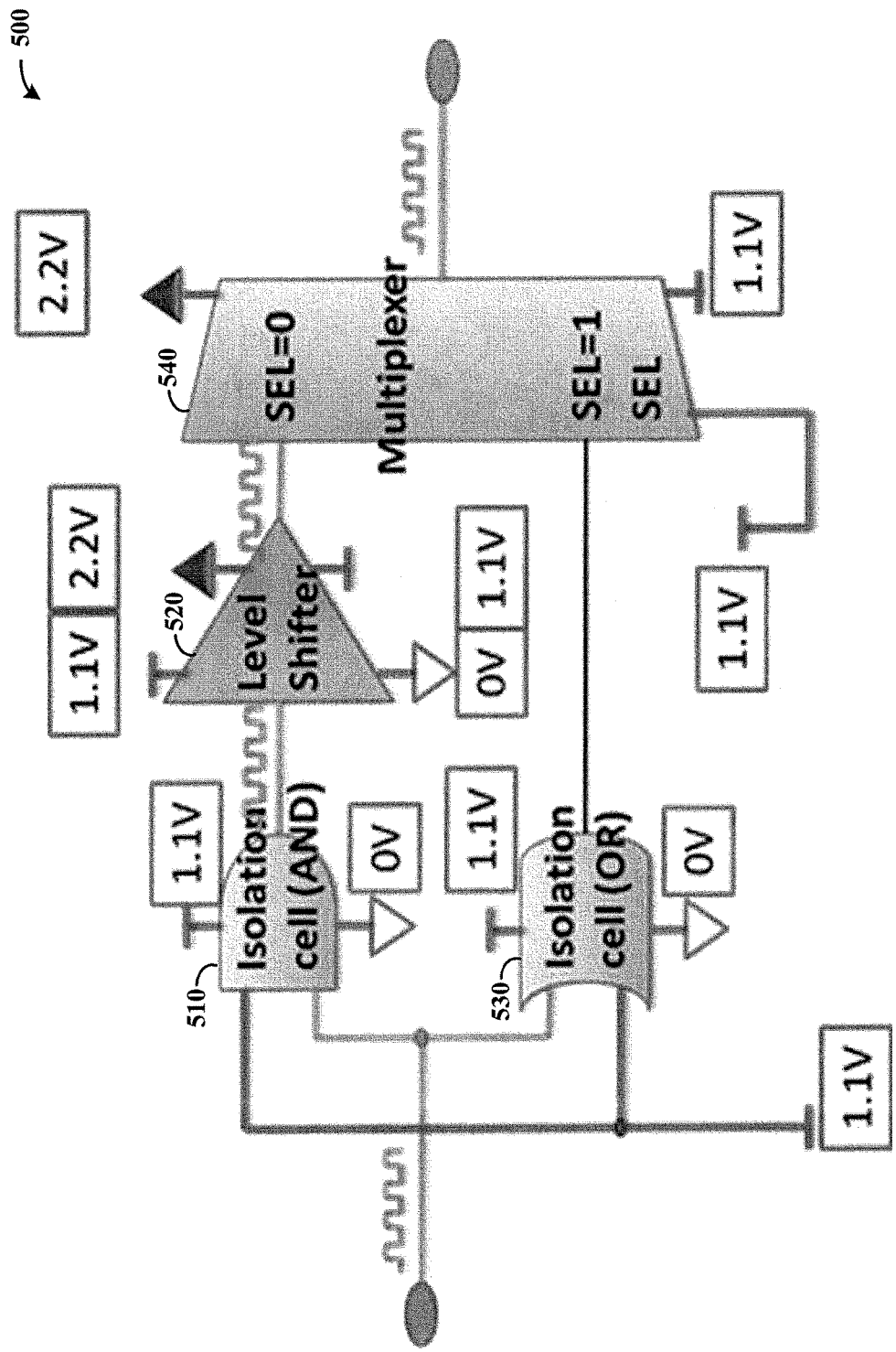
FIG. 5 shows a circuit in which a stacked mode is implemented with level shifting circuitry, in accordance with one or more embodiments.
Figure 6:
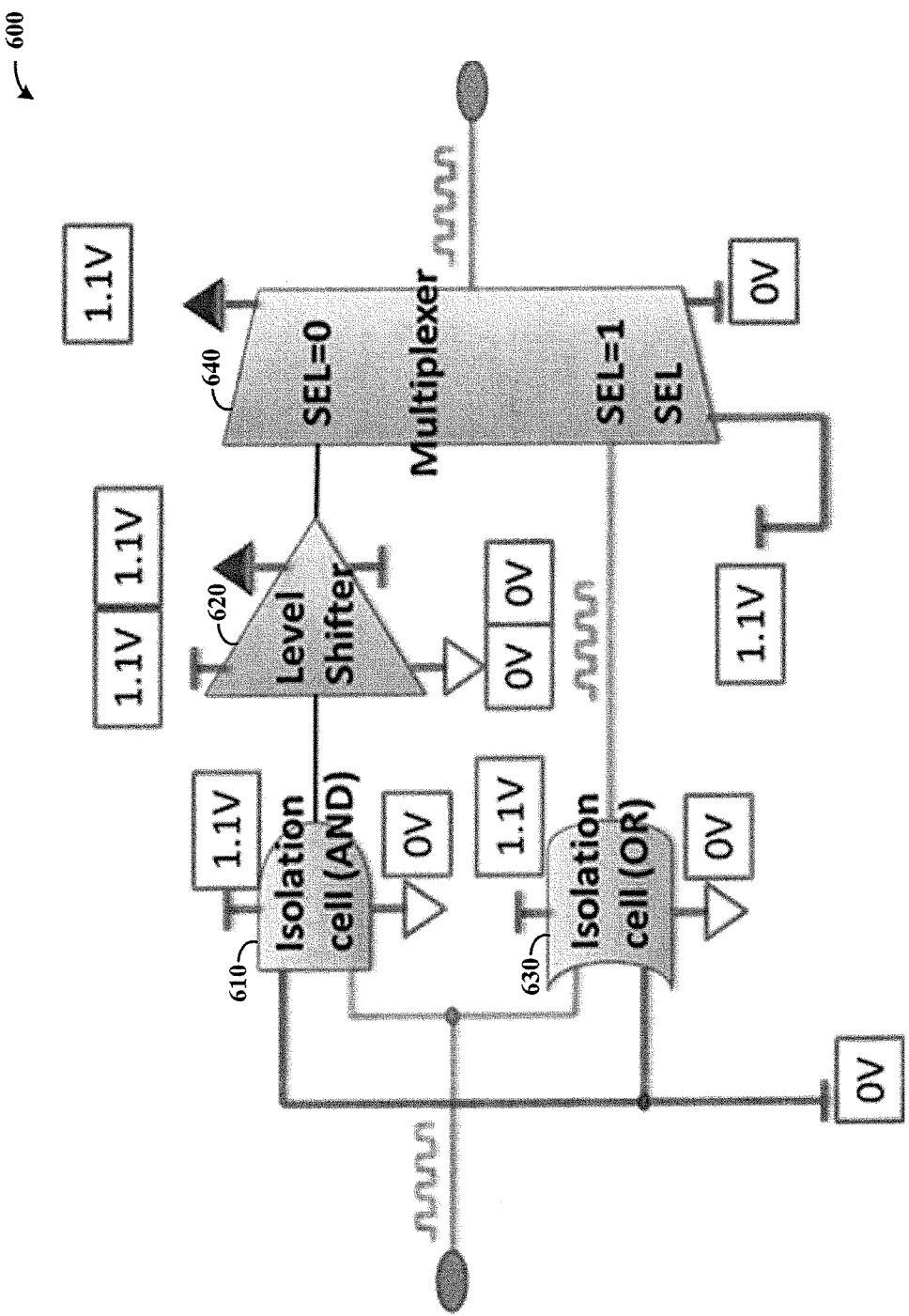
FIG. 6 shows a circuit in which a flat mode is implemented, in accordance with one or more embodiments.

FIG. 5 shows a circuit 500, in which a stacked mode is implemented with level shifting circuitry, in accordance with an example embodiment. Similarly, FIG. 6 shows a circuit 600, in which a flat mode is implemented. Various voltage levels are shown by way of example. The circuit 500 includes an isolation AND cell 510 (or other comparison circuit) and a level shifter 520 in a first circuit path, and an isolation (OR) cell 530 (or other comparison circuit) in a second circuit path. Each circuit path is connected to a multiplexer 540, which selects between the circuit paths for providing an output. The circuit 600 similarly includes an AND cell 610 and a level shifter 620 in a first circuit path, and an isolation (OR) cell 630 in a second circuit path, both of which are connected to multiplexer 640. The respective circuits 500 and 300 may be implemented in a common circuit for respective modes.

By way of example, a 1.1V voltage range is shown for respective power domains (e.g., VDD1 at 2.2V, GND1 at 1.1V, and VDD2 at 1.1V, GND2 at 0V), in which translation between voltage levels of domains in a stacked mode and a bypass mode are provided. In a stacked mode, an output of level shifter 520 is selected via AND circuit 510. In a flat mode, a bypass circuit is selected via OR circuit 630. This selection can be done without using external control signals.

In some implementations, to control the isolation cells 610 and 630 as well as the multiplexer 640, the voltage information of the opposite domain is used. For instance, a power rail of a bottom power domain for the multiplexer 640 can be used with a ground rail of the power domain for the isolation cells. If the circuit is in a stacked mode, the multiplexer 640 receives a 1.1V bottom supply voltage on its select input. This equals a ground voltage for the top/high power domain, so the level shifter data input (since SEL=0) is selected. On the other hand, when the circuit is in a flat mode, the select signal is still at 1.1V, which equals a logical '1' since the top/high domain is between 0V and 1.1V under which conditions the bypass path is selected. In this context, 0V and 1.1V can be implemented as first and second voltage levels between which the top/high domain operates. Different explicit voltages may also be used in various implementations (with both the above and following discussion).

In a stacked mode, the ground rail of the top/high power domain is 1.1V and provides a logical '1' in the bottom/low power domain (0-1.1V). The OR isolation cell 530 forces an output to 1.1V, while the AND isolation cell 510 is sensitive to the input signal level and buffers it for the level shifter input. Thus the level shifter receives the input signal and converts it to the desired voltage levels.

In a flat mode, the ground voltage of the top/high power domain that controls the two isolation cells is at 0V, which is a logical '0' in the bottom/lower power domain (also 0-1.1V in flat mode). A logical '0' will force the output of the AND isolation cell 610 to 0V while enabling the OR isolation cell 630 to bypass the signal to the multiplexer 640.

Figure 7:
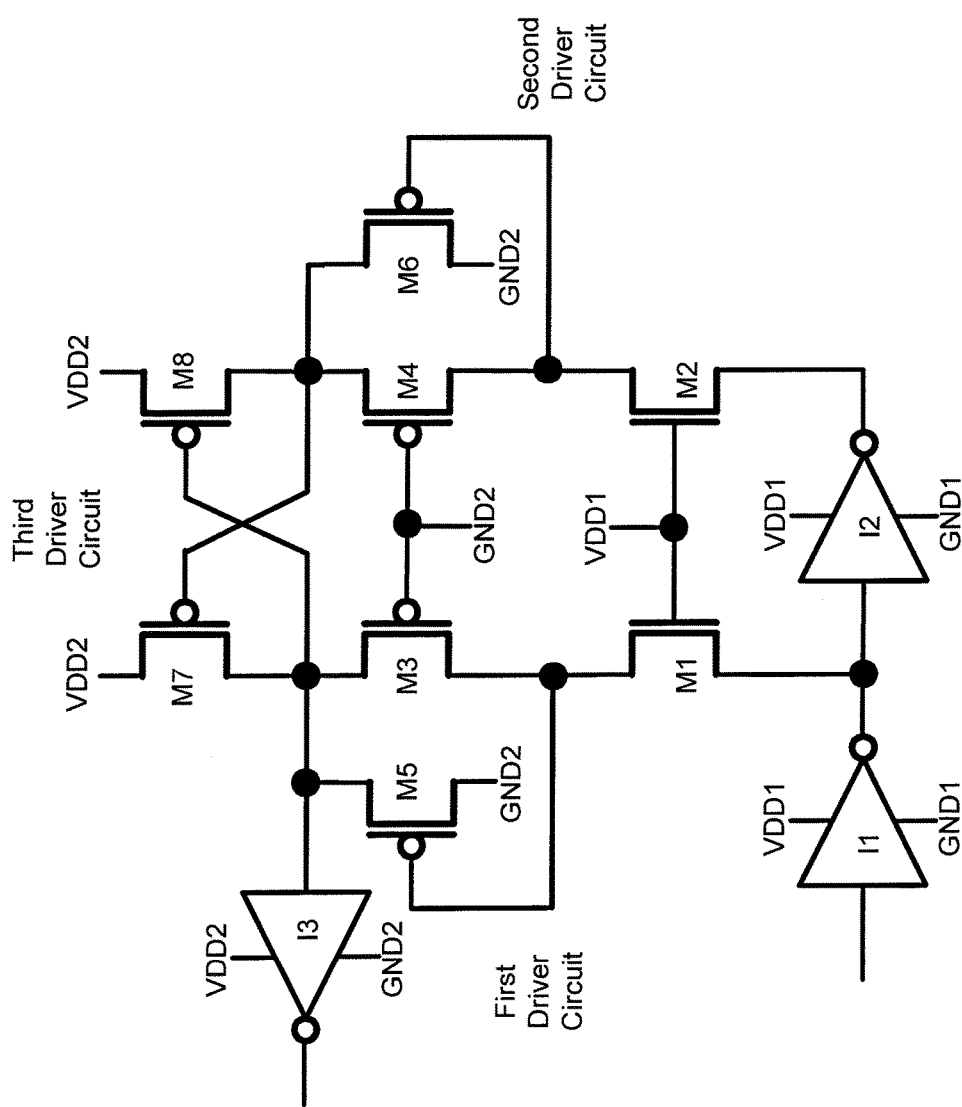
FIG. 7 shows an up-level shifter, in accordance with another embodiment.

FIG. 7 shows an up-level shifter 700, in accordance with another embodiment. In a stacked power mode, GND2 and VDD1 are the same. The up-level shifter 700 may, for example, be implemented in a manner similar to that of the level shifter apparatus 200 in FIG. 2. The above discussion of FIG. 2 may be generally applied in FIG. 7.

Figure 8:
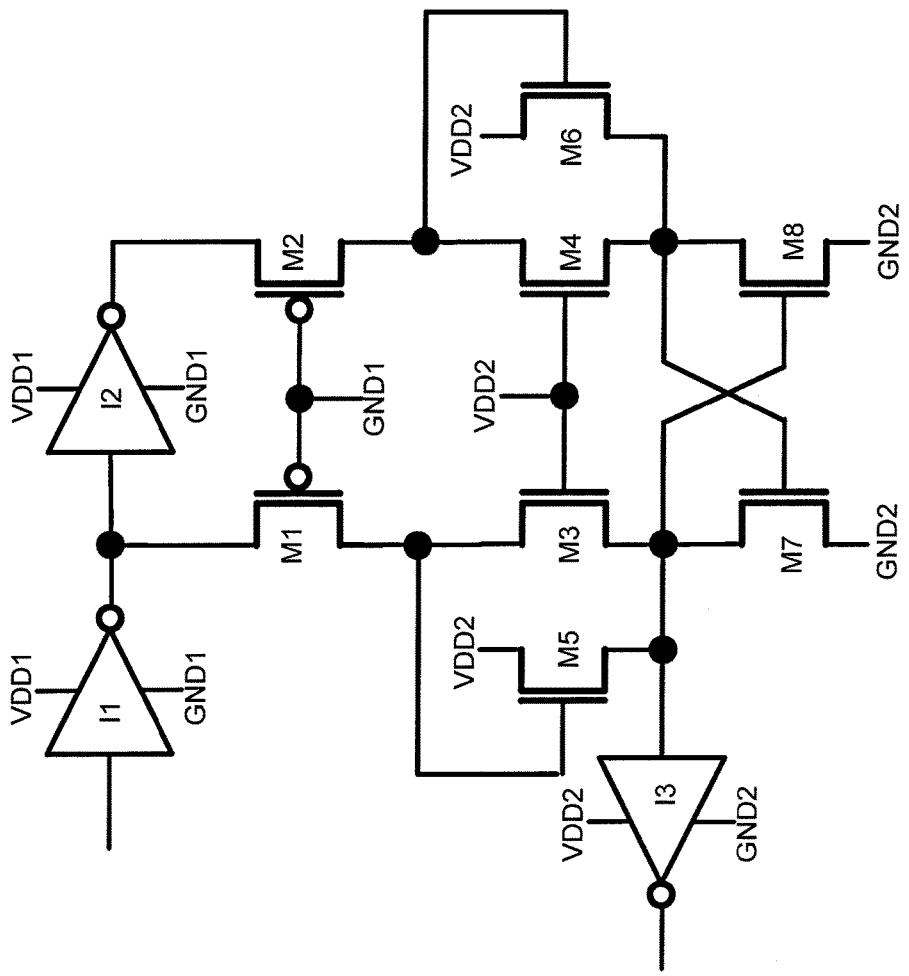
FIG. 8 shows a down-level shifter, in accordance with another example embodiment.

FIG. 8 shows a down-level shifter 800, in accordance with another example embodiment. In a stacked power mode, the voltage of GND 1 and VDD2 are the same. The down-level shifter 800 may, for example, be implemented in a manner similar to that of the level shifter apparatus 200 in FIG. 2, or as a corollary to FIG. 7 (similarly shifting, but from high to low, rather than from low to high). The above discussion of FIG. 2 may be generally applied in FIG. 8.

In various implementations, the voltage levels of the respective components in FIGS. 7 and 8 are implemented in accordance with the following Table 1, for stacked and flat power modes.

TABLE 1

|  | First (Stacked) Power Mode | | Second (Flat) Power Mode | |
| --- | --- | --- | --- | --- |
|  | Up level shifter | Down level shifter | Up level shifter | Down level shifter |
| GND1 | V1 | V2 | V1 | V1 |
| VDD1 | V2 | V3 | V2 | V2 |
| GND2 | V2 | V1 | V1 | V1 |
| VDD2 | V3 | V2 | V2 | V2 |

V1: First voltage level
V2: Second voltage level
V3: Third voltage level

Figure 9:
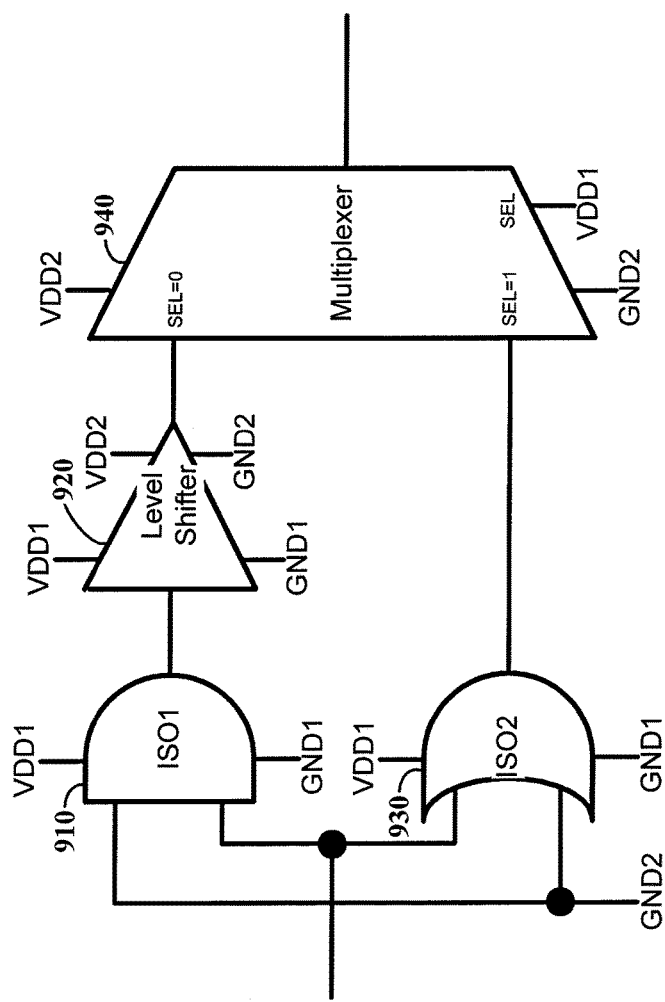
FIG. 9 shows an up-level shifter for a stacked power mode, in accordance with one or more embodiments.

FIG. 9 shows an up-level shifter 900 for a stacked power mode, in accordance with one or more embodiments. The up-level shifter 900 may, for example, be implemented in connection with the approach characterized in FIGS. 4, 5 and/or 6. For a stacked power mode, the voltage of GND2 and VDD1 are the same. An AND gate 910 provides an output to level shifter 920, which is output by multiplexer 940 under the stacked mode. An OR gate 930 operates to pass an output to the multiplexer 940 for a flat mode.

Figure 10:
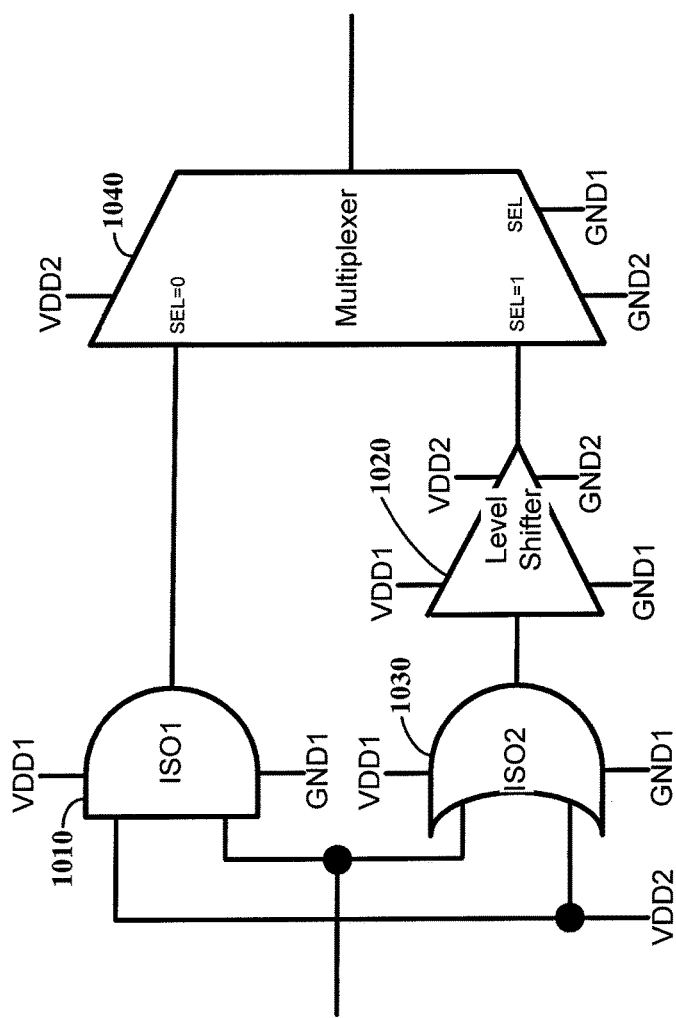
FIG. 10 shows a down-level shifter for a stacked power mode, in accordance with one or more embodiments.

FIG. 10 shows a down-level shifter 1000, in accordance with one or more embodiments. The down-level shifter 1000 may, for example, be implemented in connection with the approach characterized in FIGS. 4, 5 and/or 6. For the stacked power mode, the voltage of GND1 and VDD2 are the same. An OR gate 1030 operates in a stacked mode to couple a signal to a level shifter 1020, which provides an output to multiplexer 1040 that selects the (down-shifted) output. An AND gate 1010 operates in a flat mode to couple and output to the multiplexer 1040.

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. Such an approach can be used, for example, with blocks as shown in FIG. 1. In various embodiments, a hard-wired control block can be used for such an implementation. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, in some embodiments circuits as shown in FIG. 2 may be implemented with different circuitry to achieve related functionality. Further, additional level shifters may be implemented to serve additional power domains, with more or fewer circuits operating for communicating signals therebetween, and operating at voltage ranges that may be tailored to each circuit. Various embodiments may be implemented in manners different than those illustrated by the Figures. For instance, level shifting may be carried out in a manner similar to that characterized in U.S. patent application Ser. No. 13/856,184. Such modifications do not depart from the true spirit and scope of various aspects of the invention, including aspects set forth in the claims.

What is claimed is:

1. An apparatus comprising:
   a first circuit configured and arranged to provide differential outputs that vary between first and second voltage levels, based on transitions of an input signal received from a first power domain that operates between the first and second voltage levels;
a second circuit having first and second driver circuits coupled to a first voltage rail configured and arranged to operate at the second voltage level, the first driver circuit being coupled to a first one of the differential outputs and the second driver circuit being coupled to a second one of the differential outputs; and
a third driver circuit coupled to a second voltage rail configured and arranged to operate at a third voltage level, the second voltage level being between the first and third voltage levels, the third driver circuit being and configured and arranged with the first and second circuits to level-shift the input signal from the first power domain to an output signal on a second power domain that operates between the second and third voltage levels by
driving an output circuit at the second voltage level in response to the input signal being at the first voltage level,
driving the output circuit at the third voltage level in response to the input signal being at the second voltage level, wherein the first driver circuit includes first and second transistors, the first transistor having its gate driven by the first one of the differential outputs and having its source and drain coupled between the second voltage level and an output terminal, the second transistor having its gate driven by the second voltage level and having its source and drain coupled between the first one of the differential outputs and the output circuit, and
the second driver circuit includes third and fourth transistors, the third transistor having its gate driven by the second one of the differential outputs and having its source and drain coupled between the second voltage level and the third driver circuit, the fourth transistor having its gate driven by the second voltage level and having its source and drain coupled between the second one of the differential outputs and the third driver circuit.

2. The apparatus of claim 1, wherein the third driver circuit is configured and arranged with the first and second driver circuits to
transition the output signal from the second voltage level to the third voltage level by switching the third driver circuit from a first state in which the third voltage level is provided to the output circuit, to a second state in which the second voltage rail at the third voltage level is decoupled from the output circuit, and
transition the output signal from the third voltage level to the second voltage level by switching the third driver circuit from the second state to the first state in which the third voltage level is provided to the output circuit.

3. The apparatus of claim 2, wherein the third driver circuit includes:
a first transistor having its gate connected to an output of the second driver circuit and having its source and drain connected between the second voltage rail at the third voltage level and the output circuit, and
a second transistor having its gate connected to an output of the first driver circuit and the output circuit, and its source and drain connected between the second driver circuit and the second voltage rail at the third voltage level.

4. The apparatus of claim 1, wherein the first circuit includes:

a first inverter circuit configured and arranged to invert the input signal;
a second inverter circuit coupled to an output of the first inverter circuit, and configured and arranged to invert the output;
a seventh transistor having its source and drain coupled between the output of the first inverter circuit and the first driver circuit, and having its gate connected to the first voltage rail at the second voltage level; and
an eighth transistor having its source and drain coupled between an output of the second inverter circuit and the second driver circuit.

5. The apparatus of claim 4, wherein the output circuit includes an inverter having an input coupled to the first driver circuit and the third driver circuit, and configured and arranged to generate the output signal by:
generating an output at the second voltage level, in response to the input receiving the third voltage level, and
generating an output at the third voltage level, in response to the input receiving the second voltage level.

6. The apparatus of claim 1, wherein the first circuit is configured and arranged to:
operate in a first state by coupling the first one of the differential outputs to the first driver circuit, and decoupling the second one of the differential outputs from the second driver circuit, and
operate in a second state by coupling the second one of the differential outputs to the second driver circuit, and decoupling the first one of the differential outputs from the first driver circuit.

7. The apparatus of claim 1, wherein the output circuit includes an inverter having an input coupled to the first driver circuit and the third driver circuit, and configured and arranged to generate the output signal by:
generating an output at the second voltage level, in response to the input receiving the third voltage level, and
generating an output at the third voltage level, in response to the input receiving the second voltage level.

8. The apparatus of claim 1, wherein the third driver circuit is configured and arranged to operate as a latch by driving the output circuit at the second voltage level for a first time duration corresponding to a first state, and driving the output circuit at the third voltage level for a second time duration corresponding to a second state.

9. An apparatus comprising:
a first circuit configured and arranged to provide differential outputs that vary between first and second voltage levels, based on transitions of an input signal received from a first power domain that operates between the first and second voltage levels;
a second circuit having first and second driver circuits coupled to a first voltage rail configured and arranged to operate at the second voltage level, the first driver circuit being coupled to a first one of the differential outputs and the second driver circuit being coupled to a second one of the differential outputs; and
a third driver circuit coupled to a second voltage rail configured and arranged to operate at a third voltage level, the second voltage level being between the first and third voltage levels, the third driver circuit being and configured and arranged with the first and second circuits to level-shift the input signal from the first power domain to an output signal on a second power domain that operates between the second and third voltage levels by driving an output circuit at the second voltage level in response to the input signal being at the first voltage level, and driving the output circuit at the third voltage level in response to the input signal being at the second voltage level, wherein the first circuit includes:

a first inverter circuit configured and arranged to invert the input signal;

a second inverter circuit coupled to an output of the first inverter circuit, and configured and arranged to invert the output;

a first transistor having its source and drain coupled between the output of the first inverter circuit and the first driver circuit, and having its gate connected to the first voltage rail at the second voltage level; and a second transistor having its source and drain coupled between an output of the second inverter circuit and the second driver circuit.

10. A method comprising:

providing differential outputs that vary between first and second voltage levels, based on transitions of an input signal received from a first power domain that operates between the first and second voltage levels; and level shifting the input signal from the first power domain to an output signal on a second power domain that operates between the second voltage level and a third voltage level by, using first and second driver circuits coupled to a first voltage rail that operates at the second voltage level, in which the first driver circuit is coupled to a first one of the differential outputs and the second driver circuit is coupled to a second one of the differential outputs, and using a third driver circuit coupled to a second voltage rail that operates at the third voltage level in which the second voltage level is between the first and third voltage levels, wherein the first driver circuit includes first and second transistors, the first transistor having its gate driven by the first one of the differential outputs and having its source and drain coupled between the second voltage level and an output terminal, the second transistor having its gate driven by the second voltage level and having its source and drain coupled between the first one of the differential outputs and an output circuit, and the second driver circuit includes third and fourth transistors, the third transistor having its gate driven by the second one of the differential outputs and having its source and drain coupled between the second voltage level and the third driver circuit, the fourth transistor having its gate driven by the second voltage level and having its source and drain coupled between the second one of the differential outputs and the third driver circuit, driving the output circuit at the second voltage level in response to the input signal being at the first voltage level, and driving the output circuit at the third voltage level in response to the input signal being at the second voltage level.

11. The method of claim 10, wherein driving the output circuit includes:

transitioning the output signal from the second voltage level to the third voltage level by switching the third driver circuit from a first state in which the third voltage level is provided to the output circuit, to a second state in which the second voltage rail at the third voltage level is decoupled from the output circuit, and transitioning the output signal from the third voltage level to the second voltage level by switching the third driver circuit from the second state to the first state in which the third voltage level is provided to the output circuit.

12. The method of claim 10, further including:

operating in a first state by coupling a first one of the differential outputs to the first driver circuit, and decoupling a second one of the differential outputs from the second driver circuit, and operating in a second state by coupling the second differential output to the second driver circuit, and decoupling the first differential output from the first driver circuit.

13. The method of claim 10, wherein driving the output circuit includes:

driving the output circuit at the second voltage level in response to the input receiving the first voltage level, and driving the output at the third voltage level in response to the input receiving the second voltage level.

14. The method of claim 10, wherein level shifting the input signal includes level shifting the input signal without using a capacitive circuit to couple the first and second power domains.

* * * * *